US012805355B2

(12) United States Patent
Kim et al.

(10) Patent No.: US 12,805,355 B2
(45) Date of Patent: Nov. 17, 2026

(54) SEMICONDUCTOR DEVICE INCLUDING METAL LINES HAVING DIFFERENT METAL PITCHES

(71) Applicant: SAMSUNG ELECTRONICS CO., LTD., Suwon-si (KR)

(72) Inventors: Jintae Kim, Clifton Park, NY (US); Panjae Park, Halfmoon, NY (US); Hyojong Shin, Mechanicville, NY (US); Kang-ill Seo, Springfield, VA (US)

(73) Assignee: Samsung Electronics Co., Ltd. (KR)

(*) Notice: Subject to any disclaimer, the term of this patent is extended or adjusted under 35 U.S.C. 154(b) by 370 days.

(21) Appl. No.: 18/433,145

(22) Filed: Feb. 5, 2024

(65) Prior Publication Data

US 2025/0118676 A1 Apr. 10, 2025

Related U.S. Application Data

(60) Provisional application No. 63/542,391, filed on Oct. 4, 2023.

(51) Int. Cl.

*H10W 70/65* (2026.01)
*H10D 89/10* (2025.01)
*H10W 70/60* (2026.01)

(52) U.S. Cl.

CPC ............ *H10W 70/65* (2026.01); *H10D 89/10* (2025.01); *H10W 70/611* (2026.01)

(58) Field of Classification Search

CPC .............................. H10D 89/10; H10W 20/43
See application file for complete search history.

(56) References Cited

U.S. PATENT DOCUMENTS

| | | | | |
|---|---|---|---|---|
| 11,152,392 | B2 | 10/2021 | Do et al. | |
| 2017/0110405 | A1* | 4/2017 | Peng | H10W 20/427 |
| 2020/0104451 | A1 | 4/2020 | Huang et al. | |
| 2021/0013230 | A1 | 1/2021 | Do et al. | |
| 2022/0149075 | A1 | 5/2022 | Kumar et al. | |
| 2022/0284165 | A1 | 9/2022 | Hanchinal et al. | |
| 2023/0197605 | A1 | 6/2023 | Chen et al. | |

FOREIGN PATENT DOCUMENTS

| | | | |
|---|---|---|---|
| CN | 115223923 | A | 10/2022 |
| DE | 102019120292 | * | 6/2020 |
| KR | 102269743 | B1 * | 6/2021 |

* cited by examiner

*Primary Examiner* — Matthew L Reames
(74) *Attorney, Agent, or Firm* — Myers Bigel, P.A.

(57) ABSTRACT

Provided is a semiconductor device which may include: a plurality of gate structures arranged at a predetermined gate pitch in a $1^{st}$ direction and extended in a $2^{nd}$ direction; and a plurality of metal lines arranged at two or more different metal pitches in the $1^{st}$ direction and extended in the $2^{nd}$ direction at a same level in a $3^{rd}$ direction.

18 Claims, 14 Drawing Sheets

30B

SEMICONDUCTOR DEVICE INCLUDING METAL LINES HAVING DIFFERENT METAL PITCHES

CROSS-REFERENCE TO RELATED APPLICATION

This application is based on and claims priority to U.S. Provisional Application No. 63/542,391 filed on Oct. 4, 2023 in the U.S. Patent and Trademark Office, the disclosure of which is incorporated herein in its entirety by reference.

BACKGROUND

1. Field

Apparatuses consistent with example embodiments of the disclosure relate to a interconnect metal lines of a semiconductor device that have different metal pitches.

2. Description of Related Art

In designing a semiconductor cell architecture (or a cell block) for a semiconductor device, a plurality of metal lines are placed in one or more semiconductor cells forming the semiconductor cell architecture. The metal lines in a semiconductor cell may be configured to connect the semiconductor elements to each other or other circuit elements in the semiconductor cell or outside the semiconductor cell for power delivery or signal routing. The metal lines are typically formed for a semiconductor device in a back-end-of-line (BEOL) process, and thus, are referred to as BEOL structures, while the semiconductor elements formed for the semiconductor device in a front-end-of-line (FEOL) process are referred to as FEOL structures.

The metal lines may be categorized into M1, M2, M3, etc. by vertical levels where these metal lines are placed above semiconductor elements such as a gate structure, a channel structure, a source/drain region, etc. in a semiconductor cell. The M2 metal lines are placed vertically above the M1 metal lines and vertically below the M3 metal lines in the semiconductor cells. The metal lines at a same vertical level may have a same width, may be extended in a same direction, and may be arranged at a predetermined metal pitch. The metal lines at different vertical levels may be extended in different directions. For example, M2 metal lines in one or more semiconductor cells may be extended in the same direction as gate structures which are also arranged at a predetermined gate pitch, which is referred to as contact-poly-pitch (CPP). The metal lines at different levels may be connected through one or more vias.

As the recently developed integrated circuits require an increased device density and a higher device performance, the placement of these metal lines in one or more semiconductor cells is regarded as one of controlling factors for improving device density and device performance.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device manufactured based on a semiconductor cell or a cell block formed of one or more of the semiconductor cell, in which a plurality of gate structures have a predetermined gate pitch and a plurality of metal lines have different metal pitches, which may be whole numbers.

According to one or more embodiments, there is provided a semiconductor device which may include: a plurality of gate structures arranged at a predetermined gate pitch in a $1^{st}$ direction and extended in a $2^{nd}$ direction; and a plurality of metal lines arranged at two or more different metal pitches in the $1^{st}$ direction and extended in the $2^{nd}$ direction at a same level in a $3^{rd}$ direction.

According to one or more embodiments, there is provided a semiconductor device which may include: a plurality of gate structures arranged at a predetermined gate pitch in a $1^{st}$ direction and extended in a $2^{nd}$ direction; and a plurality of metal lines arranged in the $1^{st}$ direction to have two or more different metal-to-metal distances and extended in the $2^{nd}$ direction at a same level in a $3^{rd}$ direction.

According to one or more embodiments, there is provided a semiconductor device which may include: a plurality of gate structures arranged at a predetermined gate pitch in a $1^{st}$ direction and extended in a $2^{nd}$ direction; and a plurality of metal lines arranged in the $1^{st}$ direction, having two or more different widths in the $1^{st}$ direction, and extended in the $2^{nd}$ direction at a same level in a $3^{rd}$ direction.

According to one or more embodiments, each of the two or more different metal pitches, two or more different metal-to-metal distances, and two or more different widths is an integer multiple of a fundamental accuracy which corresponds to a resolution tolerance of a device or equipment used to manufacture the semiconductor device.

According to one or more embodiments, there is provided a semiconductor device which may include: a $1^{st}$ gate structure; and $1^{st}$ through $3^{rd}$ metal lines arranged at different metal pitches in a $1^{st}$ direction at a same level in a $3^{rd}$ direction, the $1^{st}$ through $3^{rd}$ metal lines being extended in a same $2^{nd}$ direction as the $1^{st}$ gate structure, wherein the $2^{nd}$ metal line overlaps the $1^{st}$ gate structure in a $3^{rd}$ direction.

According to one or more embodiments, there is provided a semiconductor device which may include: a $1^{st}$ gate structure; and $1^{st}$ through $3^{rd}$ metal lines arranged in a $1^{st}$ direction at a same level in a $3^{rd}$ direction, having two or more different widths, and extended in a same $2^{nd}$ direction as the $1^{st}$ gate structure, wherein the $2^{nd}$ metal line overlaps the $1^{st}$ gate structure in a $3^{rd}$ direction.

BRIEF DESCRIPTION OF DRAWINGS

Example embodiments of the disclosure will be more clearly understood from the following detailed description taken in conjunction with the accompanying drawings in which.

DETAILED DESCRIPTION

Figure 1A:
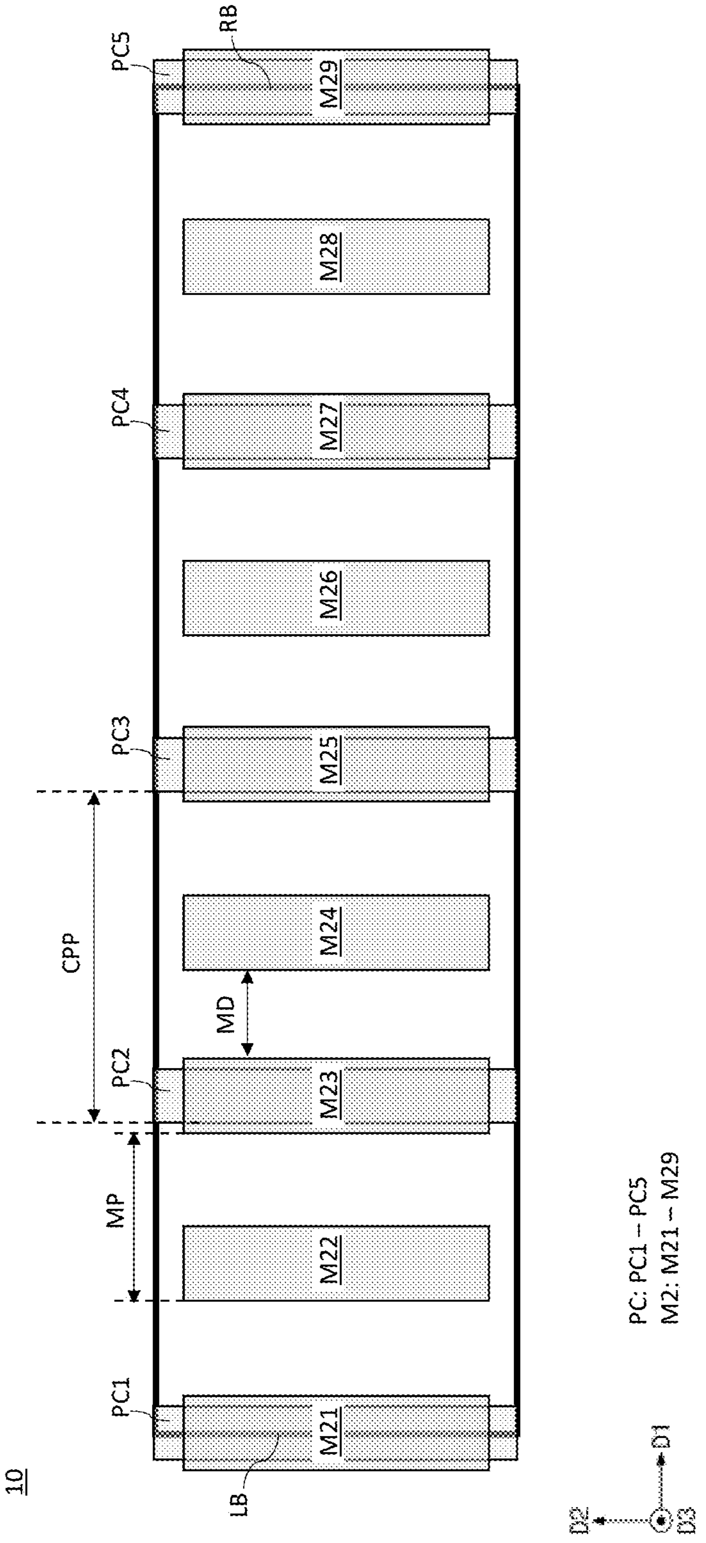
FIG. 1A illustrates a layout of a semiconductor cell in which a plurality of gate structures and a plurality of M2 metal lines are placed, according to one or more embodiments.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$", etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" is used to compare a dimension of two or more elements, the term may cover a "substantially same" dimension.

Many embodiments are described herein with reference to schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of a semiconductor device including one or more transistors and materials forming the same may or may not be described in detail herein. For example, a certain isolation layer or structure of a semiconductor device and materials forming the same may be omitted herein when this layer or structure is not related to the novel features of the embodiments.

FIG. 1A illustrates a layout of a semiconductor cell in which a plurality of gate structures and a plurality of M2 metal lines are placed, according to one or more embodiments.

Referring to FIG. 1A, a semiconductor cell 10 may include five (5) gate structures PC1-PC5 arranged in a D1 direction at a predetermined gate pitch CPP and extended in a D2 direction. Thus, the semiconductor cell 10 may be referred to as a 4-CPP cell. The semiconductor cell 10 may also include nine (9) metal lines M21-M29 arranged in the D1 direction at a predetermined metal pitch MP and extended in the D2 direction. The metal lines M21-M29 may also have a predetermined metal-to-metal distance MD. The metal lines M21-M29 may all be M2 metal lines placed next to each other at a same vertical level in a D3 direction. Thus, the metal lines M21-M29 may be collectively referred to as M2 metal lines hereafter. Further, the gate structures PC1-PC5 may be placed next to each other at a same vertical level in the D3 direction, and may be collectively referred to as gate structures PC.

Herein, the gate pitch CPP may refer to a distance between a left edge of a gate structure and a left edge of an adjacent gate structure, or a distance between a right edge of the gate structure and a right edge of the adjacent gate structure. Similarly, the metal pitch MP may refer to a distance between a left edge of a metal line and a left edge of an adjacent metal line at a same level in the D3 direction, or a distance between a right edge of the metal line and a right edge of the adjacent metal line. The metal-to-metal distance may refer to a distance between two adjacent metal lines, that is, between a right edge of a metal line and a left edge of a right-side adjacent metal line or between a left edge of a metal line and a right edge of a left-side adjacent metal line. The gat pitch, the metal pitch, and the metal-to-metal distance may all be in a nanometer scale. The D1 direction may indicate a cell-width or a cell-length direction, and the D2 direction may indicate a cell-height direction. The D3 direction may intersect the D1 and D2 directions.

In the semiconductor cell 10, M1 metal lines may be placed vertically below the M2 metal lines, and M3 metal lines may be placed vertically above the M2 metal lines in the D3 direction. The M1 metal lines and the M3 metal lines may be arranged in the D2 direction and extended in the D1 direction while the M2 metal lines are extend in the D2 direction and arranged in the D1 direction. Further, one or more active patterns extended in the D1 direction may be placed in the semiconductor cell 10 and surrounded by or adjacent to the gate structures PC. For example, source/drain regions may be formed on portions of the active patterns not surrounded by the gate structures PC. The M1 and M3 metal lines, the active patterns, and the source/drain regions are not shown herein for brevity purposes.

Among the gate structures PC and the M2 metal lines, the gate structure PC1 and the metal line M21 may be placed vertically above a left cell boundary LB in the D3 direction, and the gate structure PC5 and the metal line M29 may be placed vertically above a right cell boundary RB in the D3 direction.

In the semiconductor cell 10, the gate pitch CPP and the metal pitch MP are closely related to each other. For example, in designing a cell block for a semiconductor device using a plurality of semiconductor cells including the semiconductor cell 10, the placement of the M2 metal lines may depend on where the gate structures PC are formed in the semiconductor cells. As another example, the metal pitch MP may be set based on the gate pitch CPP such that the metal pitch MP may be set to be an integer multiple (or rational ratio) of the gate pitch CPP. Thus, a ratio of the gate pitch CPP to the metal pitch MP ratio, which is referred to as a gear ratio herebelow, of the semiconductor cell 10 may be 1:2 as shown in FIG. 1A. According to other embodiments, however, the semiconductor cell 10 may be designed to have the gear ratio 1:2, 1:3, 2:3, 2:5, 3:4, or so on.

The gear ratio may ensure that the gate pitch PC and the metal pitch MP vertically align with each other in the D3 direction at regular intervals. For example, in the semiconductor cell 10 (5) metal lines M21, M23, M25, M27 and M29 out of the nine (9) metal lines M21-M29 are aligned with the gate structures PC1-PC5, respectively, as shown in FIG. 1A, due to the gear ratio 1:2. This gear ratio may also ensure that the gate pitch CPP and the metal pitch MP align with each other when a cell block is designed by combining a plurality of semiconductor cells as shown in FIG. 1B.

Herein, a metal pitch being aligned with a gate pitch may refer to an integer multiple or rational ratio of the metal pitch being equal to the gate pitch subject to the gear ratio. For example, when the gear ratio is 1:2 as shown in FIG. 1A, twice the metal pitch MP may be equal to the gate pitch CPP. Further, herein, a metal line being aligned with a gate structure may refer to the metal line being placed vertically above the gate structure in an overlapping manner in the D3 direction.

Figure 1B:
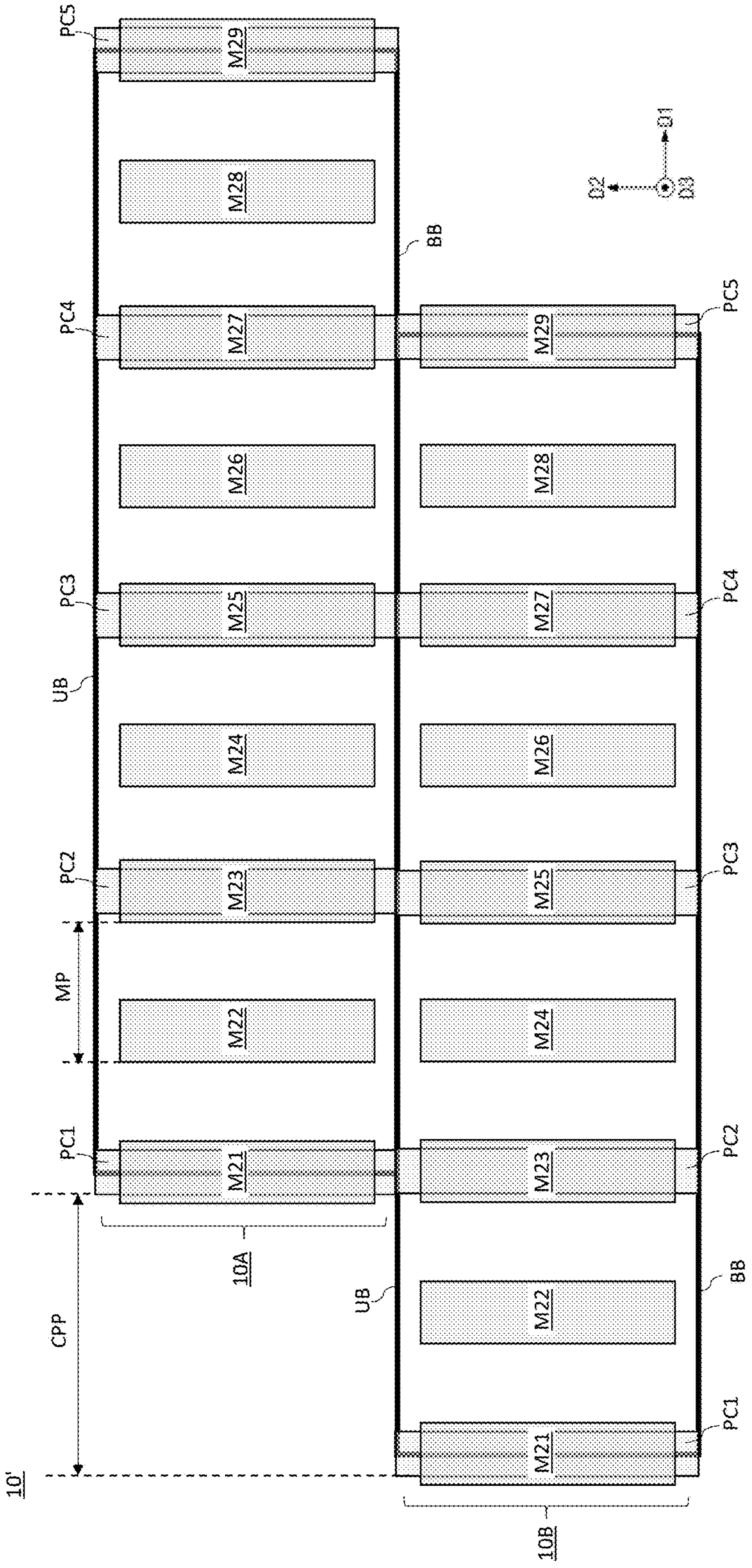
FIG. 1B illustrates a layout of a cell block formed of two semiconductor cells combined with each other, according to one or more embodiments.

FIG. 1B illustrates a layout of a cell block formed of two semiconductor cells combined with each other, according to one or more embodiments.

Referring to FIG. 1B, a cell block 10' may include two semiconductor cells 10A and 10B each of which is the same as or corresponds to the semiconductor cell 10 shown in FIG. 1A. The cell block 10' may be formed such that a lower boundary BB of the semiconductor cell 10A and an upper boundary UB of the semiconductor cell 10B partially overlaps, while the two semiconductor cells 10A and 10B are skewed in the D1 direction by one (1) CPP. Thus, a gate structure PC1 of the semiconductor cell 10A and a gate structure PC2 of the semiconductor cell 10B may be aligned with each other in the D2 direction.

Further, as each of the semiconductor cells 10A and 10B has a gear ratio 1:2 as described in reference to FIG. 1A, metal lines M21-M27 of the semiconductor cell 10A and metal lines M23-M29 of the semiconductor cell 10B may also be aligned with each other in the D2 direction, respectively. For example, the metal line M21 connected to a source/drain region in the semiconductor cell 10A may be aligned with the metal line M23 connected to a source/drain region in the semiconductor cell 10B in the D2 direction. Thus, a connection between the two source/drain regions in the different semiconductor cells 10A and 10B through the two aligned metal lines may be more reliable and shorter in distance compared to a connection between the same two source/drain regions through two non-aligned metal lines, thereby achieving an area gain and reduction of a contact resistance to improve a device performance.

In the meantime, as demand for a semiconductor device having high device density increases, decreasing both a gate pitch and a metal pitch in a semiconductor device is also required in the nanometer scale. Thus, a semiconductor cell may be often configured to have a metal pitch which does not satisfy or comply with a fundamental accuracy allowed in manufacturing a semiconductor device. The fundamental accuracy may refer to a resolution tolerance of manufacturing equipment allowed in semiconductor device manufacturing processes such as photolithography, etching, deposition, etc. For example, when the fundamental accuracy is 1 nm, the gate pitch may be set to 100 nm and the metal pitch may be set to 50 nm in a gear ratio 1:2 so that the metal pitch can be aligned with the gate pitch in the D3 direction. In this case, each of the gate pitch 100 nm and the metal pitch 50 nm is an integer multiple of the fundamental accuracy (1 nm) that satisfies the fundamental accuracy. However, when the fundamental accuracy is the same 1 nm, the gate pitch may be set to 95 nm to satisfy the fundamental accuracy. Then, the metal pitch may be set to 47.5 nm in a gear ratio 1:2 for the pitch alignment. In this case, the metal pitch 47.5 nm is not an integer multiple of the fundamental accuracy (1 nm), and thus, does not satisfy the fundamental accuracy. As another example, when the fundamental accuracy is the same 1 nm and the gat pitch is set to the same 95 nm, a gear ratio 1:3 may result in a metal pitch of 31.67 nm for the pitch alignment. In this case, the metal pitch 31.67 nm is not an integer multiple of the fundamental accuracy 1 nm, and thus, does not satisfy the fundamental accuracy. In these examples, metal-to-metal distances may also be set to an accuracy not satisfying the fundamental accuracy depending on a width of each metal line.

When the metal pitches and/or the metal-to-metal distances do not satisfy the fundamental accuracy, a process risk in photolithography, patterning or deposition for manufacturing the metal lines will be very complicated and challenging. A layout of an example semiconductor cell having a metal pitch which does not satisfy a fundamental accuracy is described below.

Figure 2:
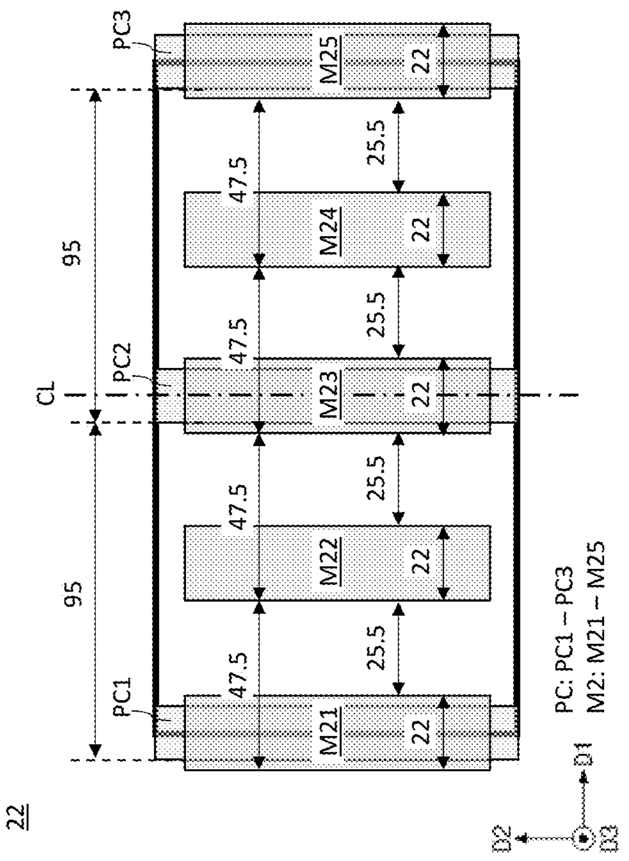
FIG. 2 illustrates a layout of a semiconductor cell including a plurality of M2 metal lines having a metal pitch that does not satisfy a fundamental accuracy, according to one or more embodiments.

FIG. 2 illustrates a layout of a semiconductor cell including a plurality of M2 metal lines having a metal pitch that does not satisfy a fundamental accuracy, according to one or more embodiments.

Referring to FIG. 2, a semiconductor cell 20 may include three (3) gate structures PC1-PC3 extended in the D2 direction and arranged in the D1 direction. The semiconductor cell 20 may also include five (5) M2 metal lines M21-M25 extended in the D2 direction and arranged in the D1 direction in a 1:2 gear ratio. Among the M2 metal lines, the metal lines M21, M23 and M25 may be placed above or aligned with the gate structures PC1, PC2 and PC3, respectively, in an overlapping manner in the D3 direction. For example, the metal line M23 may be aligned with the $2^{nd}$ gate structure PC2 such that a center line CL of the metal line M23 may overlap a center line of the $2^{nd}$ gate structure PC2 in the D3 direction. Herein, a center line of each of a semiconductor cell, a metal line, and a gate structure refers to a virtual center line in the D2 direction.

In the semiconductor cell 20, when a fundamental accuracy is 1 nm, the gate structures PC may be arranged in the D1 direction at a gate pitch of 95 nm which is an integer multiple of the fundamental accuracy to satisfy the fundamental accuracy. However, the M2 metal lines may be arranged in the D1 direction at a metal pitch of 47.5 nm in the 1:2 gear ratio so that the metal pitch and the gate pitch can be aligned with each other in the D3 direction. This metal pitch 47.5 nm is not an integer multiple of the fundamental accuracy, and thus, fails to satisfy the fundamental accuracy. Here, the M2 metal lines may each have a horizontal width of 22 nm in the D1 direction, which may not necessarily be equal to a horizontal width of each of the gate structures PC1-PC3, but is an integer multiple of the fundamental accuracy to satisfy the fundamental accuracy. Then, the semiconductor cell 20 may have a metal-to-metal distance, that is, 25.5 nm, and this is also not an integer multiple of the fundamental accuracy, failing to satisfy the fundamental accuracy.

Thus, when the fundamental accuracy is 1 nm, patterning the M2 metal lines of the semiconductor cell 20 having the 47.5-nm metal pitch and the 25.5 nm metal-to-metal distance will be very complicated and challenging, to increase a process risk while the desired pitch alignment may not be achieved.

Embodiments presented herebelow may address the foregoing process risk in manufacturing a semiconductor device including metal lines aligned with a gate pitch.

Figure 3A:
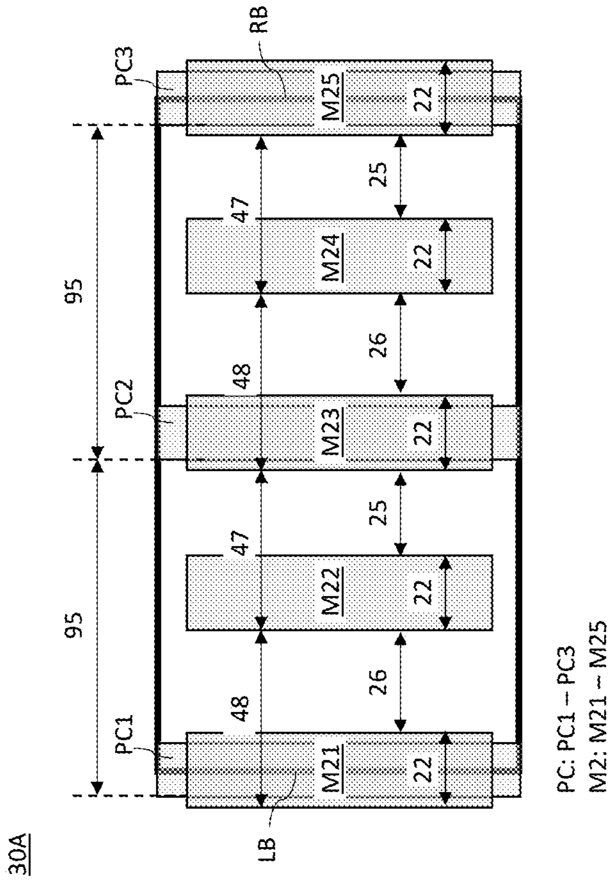
FIG. 3A illustrates a layout of a semiconductor cell including a plurality of M2 metal lines having different metal pitches and different metal-to-metal distances that satisfy a fundamental accuracy, according to one or more embodiments.

FIG. 3A illustrates a layout of a semiconductor cell including a plurality of M2 metal lines having different metal pitches and different metal-to-metal distances that satisfy a fundamental accuracy, according to one or more embodiments.

Referring to FIG. 3A, a semiconductor cell 30A may include the same or similar gate structures PC1-PC3 and M2 metal lines M21-M25 in the gear ratio 1:2 as those of the semiconductor cell 20 shown in FIG. 2 except that the M2 metal lines in the semiconductor cell 30A are arranged in the D1 direction to have two different metal pitches and two different metal-to-metal distances.

For example, when a fundamental accuracy is 1 nm, the semiconductor cell 30A may be configured such that a gate pitch is set to the same 95 nm as in the semiconductor cell 20 of FIG. 2. Further, metal pitches across metal lines M21 through M25 may be set to 48 nm, 47 nm, 48 nm, and 47 nm, respectively. In other words, a metal pitch between the metal lines M21 and M22 may be set to 48 nm, a metal pitch between the metal lines M22 and M23 may be set to 47 nm, a metal pitch between the metal lines M23 and M24 may be set to 48 nm, and a metal pitch between the metal lines M24 and M25 may be set to 47 nm. Further, the semiconductor cell 30A may have metal-to-metal distances of 26 nm, 25 nm, 26 nm, and 25 nm across the metal lines M21 through the M25, respectively, as shown in FIG. 3A.

Thus, in the semiconductor cell 30A, each of the metal pitches 48 nm and 47 nm, the metal-to-metal distances 26 nm and 25 nm, and the metal width 22 nm is an integer multiple of the fundamental accuracy (1 nm) to satisfy the fundamental accuracy regardless of the gate pitch and the gear ratio, so that the process risk that may occur in manufacturing a semiconductor device based on the semiconductor cell 20 of FIG. 2 may be avoided.

However, the metal lines M21, M23 and M25 may still be placed above or aligned with the gate structures PC1, PC2 and PC3, respectively, in an overlapping manner in the D3 direction in the 1:2 gear ratio structure. Further, metal pitches across these three metal lines M21, M23 and M25 respectively aligned with the gate structures PC1, PC2 and PC3 may be the same. In other words, a metal pitch (48 nm+47 nm) between the metal lines M21 and M23 may be the same as a metal pitch (48 nm+47 nm) between the metal lines M23 and M25, that is, 95 nm. Thus, a metal pitch between two metal lines aligned with two adjacent gate structures may be the same as a metal pitch between other two metal lines aligned with other two adjacent gate structures, and these metal pitches may also be the same as a gate pitch of these gate structures. This relationship between the metal pitch and the gate pitch may not be limited to the above embodiment of FIG. 3A.

Figure 3B:
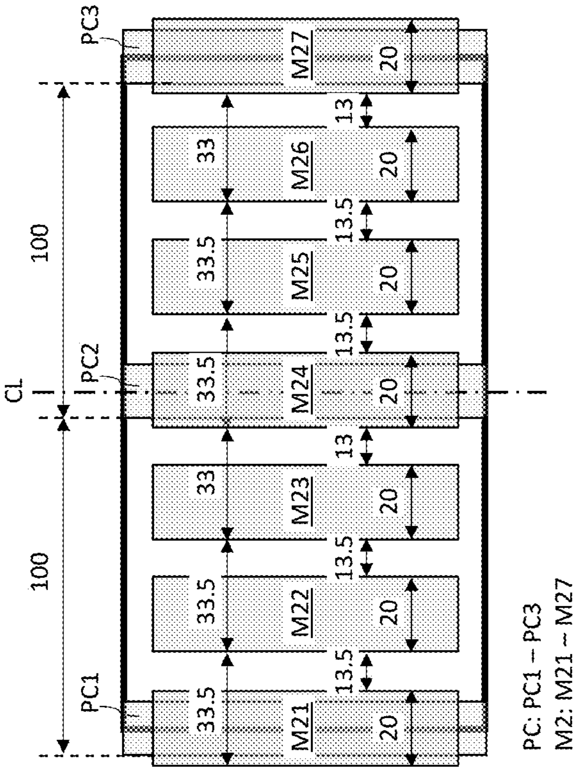
FIG. 3B illustrates a layout of another semiconductor cell including a plurality of M2 metal lines having different metal pitches and different metal-to-metal distances that satisfy a fundamental accuracy, according to one or more embodiments.

FIG. 3B illustrates a layout of another semiconductor cell including a plurality of M2 metal lines having different metal pitches and different metal-to-metal distances that satisfy a fundamental accuracy, according to one or more embodiments.

Referring to FIG. 3B, when a fundamental accuracy is 0.5 nm, a semiconductor cell 30B may have three (3) gate structures PC1-PC3 arranged in the D1 direction at a gate pitch 100 nm. Further, in a 1:3 gear ratio structure, the semiconductor cell 30B may have seven (7) M2 metal lines M21-M27 arranged in the D1 direction at two different metal pitches 33.5 nm and 33 nm and having two different metal-to-metal distances 13.5 nm and 13 nm. The M2 metal lines in the semiconductor cell 30B may each have a metal width 20 nm.

Here, each of the gate pitch 100 nm, the metal pitches 33.5 and 33, the metal-to-metal distances 13.5 and 13 and the metal width 20 is an integer multiple of the fundamental accuracy to satisfy the fundamental accuracy (0.5 nm), regardless of the gate pitch and the gear ratio. Thus, the process risk that may occur in manufacturing a semiconductor device based on the semiconductor cell 20 of FIG. 2 may also be avoided.

Further, as in the semiconductor cell 30A, the semiconductor cell 30B may also provide metal pitches across the three metal lines M21, M24 and M27 respectively aligned with the gate structures PC1, PC2 and PC3 may be the same. In other words, a metal pitch (33.5 nm+33.5 nm+33 nm) between the metal lines M21 and M24 may be the same as a metal pitch (33.5 nm+33.5 nm+33 nm) between the metal lines M24 and M27.

In the meantime, each of the semiconductor cells 30A and 30B is a 2-CPP cell having two different metal pitches and two different metal-to-metal distances. However, a 1-CPP cell may also be implemented to have two different metal pitches and two different metal-to-metal distances, as shown in FIG. 3C.

Figure 3C:
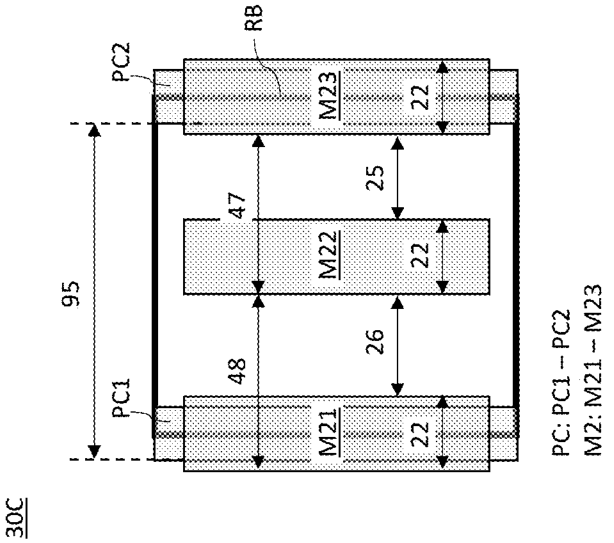
FIG. 3C illustrates a layout of still another semiconductor cell including a plurality of M2 metal lines having multiple metal pitches and multiple metal-to-metal distances, according to one or more embodiments.

Referring to FIG. 3C, a semiconductor cell 30C may include the same gate structures PC1, PC2 and the same M2 metal lines M21, M22 and M23 included in the semiconductor cell 30A of FIG. 3A in a 1-CPP cell. Thus, the semiconductor cell 30A may be obtained by placing two of the semiconductor cell 30C side by side in the D1 direction such that a right boundary of one semiconductor cell 30C is aligned with (or forms) a left boundary of the other semiconductor cell 30C.

Like the semiconductor cell 30A, the semiconductor cell 30C may also have the gate pitch of 95 nm. Further, by placing the metal lines M21, M22 and M23 to have two different metal pitches of 48 nm and 47 nm, two different metal-to-metal distances 26 nm and 25 nm, and the metal width 22 nm that satisfy a fundamental accuracy, a process risk at the decimal-nanometer accuracy may be avoided as in the above embodiment of the semiconductor cell 30A.

Figure 4:
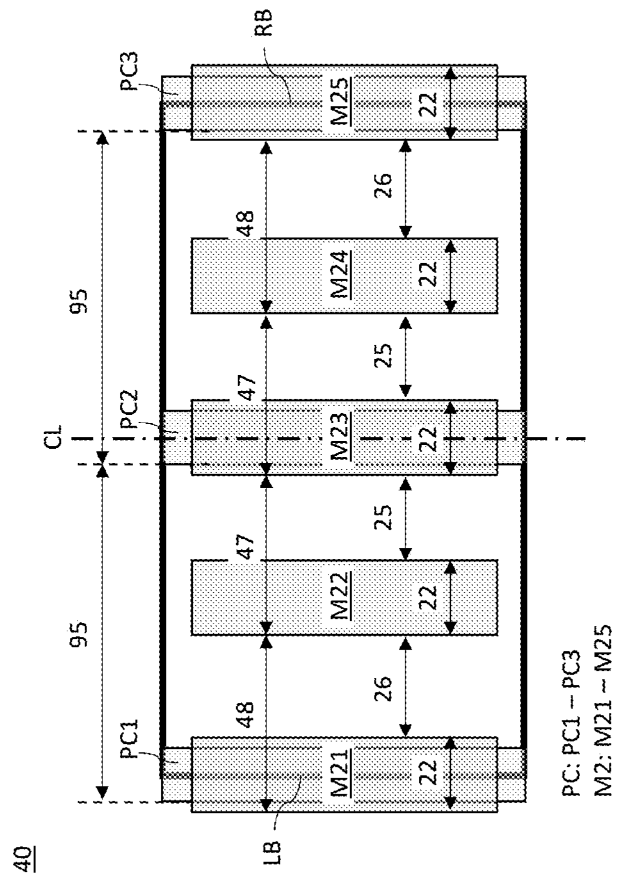
FIG. 4 illustrates a layout of still another semiconductor cell including a plurality of M2 metal lines having different metal pitches and different metal-to-metal distances that satisfy a fundamental accuracy, according to one or more embodiments.

FIG. 4 illustrates a layout of still another semiconductor cell including a plurality of M2 metal lines having different metal pitches and different metal-to-metal distances that satisfy a fundamental accuracy, according to one or more embodiments.

Referring to FIG. 4, a semiconductor cell 40 may include the same or similar gate structures PC1-PC3 and M2 metal lines M21-M25 as those of the semiconductor cell 30A shown in FIG. 3A except that the M2 metal lines in the semiconductor cell 40 are arranged in the D1 direction to have two different metal pitches and two different metal-to-metal distances in a manner different from those of the semiconductor cell 30A.

For example, when a fundamental accuracy is 1 nm, the semiconductor cell 40 may be configured such that a gate pitch is set to the same 95 nm as in the semiconductor cell 30A of FIG. 3A, and metal pitches across metal lines M21 through M25 are set to 48 nm, 47 nm, 47 nm, and 48 nm, respectively. In other words, a metal pitch between the metal lines M21 and M22 may be set to 48 nm, a metal pitch between the metal lines M22 and M23 may be set to 47 nm, a metal pitch between the metal lines M23 and M24 may be set to 47 nm, and a metal pitch between the metal lines M24 and M25 may be set to 48 nm. Further, the semiconductor cell 30B may have metal-to-metal distances of 26 nm, 25 nm, 25 nm, and 26 nm across the metal lines M21 through the M25, respectively, as shown in FIG. 3B.

Thus, also in the semiconductor cell 30B, each of the metal pitches 48 nm and 47 nm, the metal-to-metal distances 26 nm and 25 nm, and the metal width 22 nm is an integer multiple of the fundamental accuracy (1 nm), to satisfy the fundamental accuracy regardless of the gate pitch and the gear ratio, so that the process risk that may occur manufacturing a semiconductor device based on the semiconductor cell 20 of FIG. 2 may be avoided.

Still, the metal lines M21, M23 and M25 may be placed above or aligned with the gate structures PC1, PC2 and PC3, respectively, in an overlapping manner in the D3 direction in the 1:2 gear ratio structure. Further, metal pitches across these three metal lines M21, M23 and M25 respectively aligned with the gate structures PC1, PC2 and PC3 may be the same. In other words, a metal pitch (48 nm+47 nm) between the metal lines M21 and M23 may be the same as a metal pitch (47 nm+48 nm) between the metal lines M23 and M25, that is, 95 nm.

In the meantime, the semiconductor cell 40 may be configured such that the placement of the gate structures PC and the M2 metal lines in a left half thereof and that in a right half of thereof are symmetric to each other with respect to a center line CL of the semiconductor cell 40 which may be a center line of the 2$^{nd}$ gate structure PC2 and a center line of the metal line M23. For example, the metal-to-metal distances 26 nm and 25 nm in the left half may be symmetrical to the metal-to-metal distances 25 nm and 26 nm in the right half with respect to the center line CL of the semiconductor cell 40.

The semiconductor cell 40 may be obtained by placing the semiconductor cell 30C of FIG. 3B and a flipped semiconductor cell of the semiconductor cell 30C side by side in the D1 direction such that a right boundary RB of the semiconductor cell 30C is aligned with (or forms) a left boundary of the flipped semiconductor cell of the semiconductor cell 30C. The flipped semiconductor cell of the semiconductor cell 30C may be formed by flipping (or turning) the semiconductor cell 30C with respect to the right boundary RB of the semiconductor cell 30C.

This symmetric placement of the gate structures PC and the M2 metal lines in the semiconductor cell 40 may enable a cell block based on the semiconductor cell 40 to achieve an area gain and an improved device performance compared to a cell block based on the semiconductor cell 30A, as described below in reference to FIGS. 5 and 6.

Figure 5:
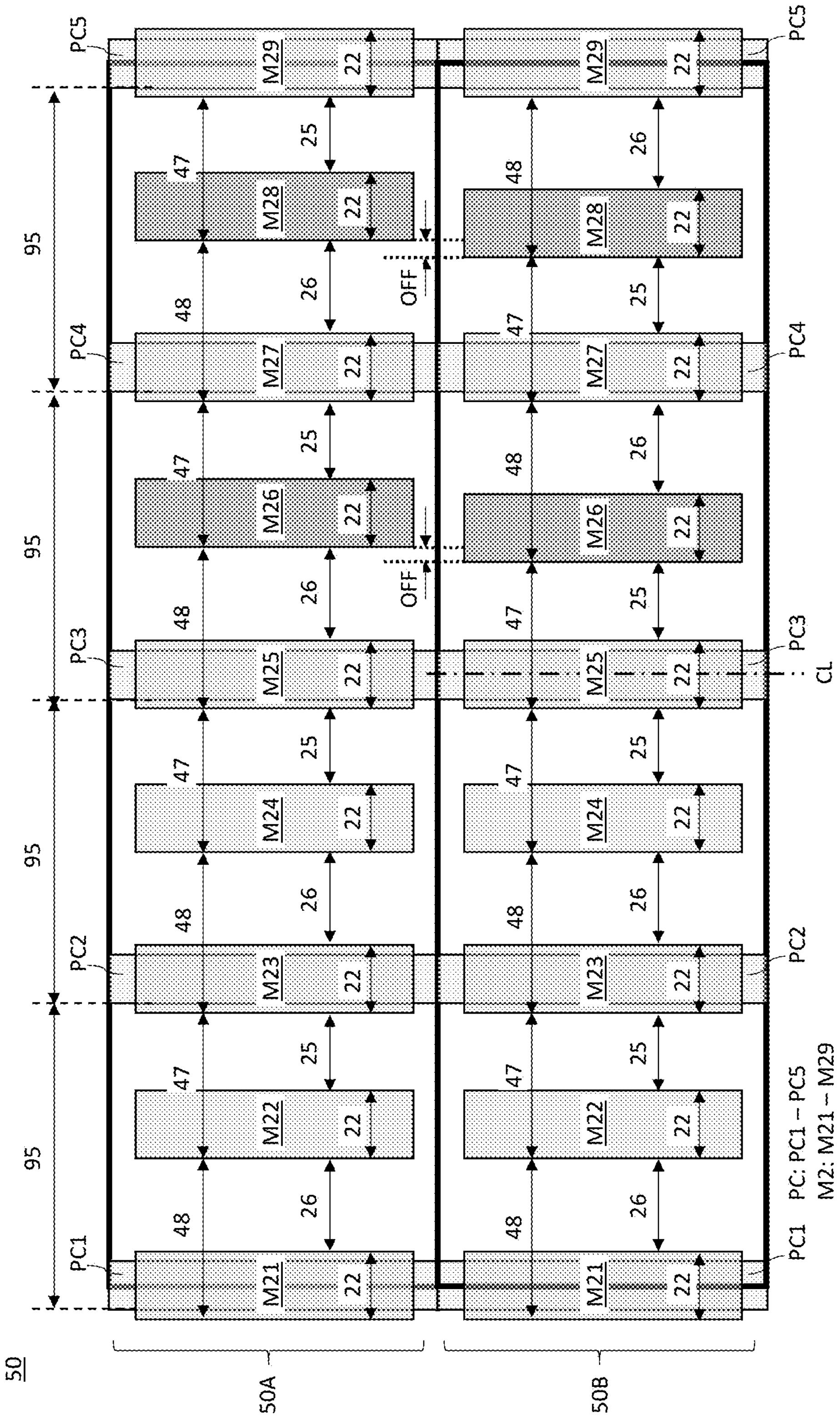
FIG. 5 illustrates a layout of a cell block formed of a plurality of semiconductor cells based on the semiconductor cell of FIG. 3A, according to one or more embodiments.

FIG. 5 illustrates a layout of a cell block formed of a plurality of semiconductor cells based on the semiconductor cell of FIG. 3A, according to one or more embodiments.

Referring to FIG. 5, a cell block 50 may be formed by combining a semiconductor cell 50A and a semiconductor cell 50B such that a lower boundary of the semiconductor cell 50A and an upper boundary of the semiconductor cell 50B are aligned with each other.

Further, the semiconductor cell 50A may be formed by placing two of the semiconductor cell 30A of FIG. 3A side by side in the D1 direction such that a right boundary RB of one semiconductor cell 30A is aligned with a left boundary LB of the other semiconductor cell 30A. Thus, the semiconductor cell 50A may include gate structures PC1-PC5 arranged in the D1 direction at a gate pitch of 95 nm and M2 metal lines M21-M29 arranged in the D1 direction at two different metal pitches 48 nm and 47 nm and having two different metal-to-metal distances 26 nm and 25 nm.

In contrast, the semiconductor cell 50B may be obtained by placing the semiconductor cell 30A and a flipped semiconductor cell of the semiconductor cell 30A side by side in the D1 direction such that a right boundary RB of the semiconductor cell 30A is aligned with (or forms) a left boundary of the flipped semiconductor cell of the semiconductor cell 30A. The flipped semiconductor cell of the semiconductor cell 30A may be formed by flipping (or turning) the semiconductor cell 30A with respect to the right boundary RB of the semiconductor cell 30A. Thus, the placement of the gate structures PC and the M2 metal lines in a left half of the semiconductor cell 50B and that in a right half of the semiconductor cell 50B may be symmetric to each other with respect to a center line CL of the semiconductor cell 50B which may be a center line of the $3^{rd}$ gate structure PC3 and a center line of the metal line M25.

A cell block may be formed by placing one same semiconductor cell side by side in a repeated manner or by flipping a semiconductor cell and combining the flipped semiconductor cell with the original semiconductor cell. Here, the cell flipping in the above-described manner may be performed, for example, to shorten a signal routing path between two same logic circuits (e.g., an inverter) implemented by two same semiconductor cells when an output signal from an output pin of one semiconductor cell is input to an input pin of the other semiconductor cell as an input signal.

However, in the formation of the cell block 50 by combining the semiconductor cells 50A and 50B as shown in FIG. 5, the metal lines M26 and M28 of the semiconductor cell 50A may not be aligned with the metal lines M26 and M28 of the semiconductor cell 50B, respectively, in the D2 direction, and instead, may have an horizontal offset OFF. Thus, a connection between two cell elements (e.g., source/drain regions) in the semiconductor cells 50A and 50B through the two non-aligned metal lines M26 (or M28) may not be reliable and may cause an additional area compared to a connection of the same two cell elements through two aligned metal lines as described below in reference to FIG. 6.

Figure 6:
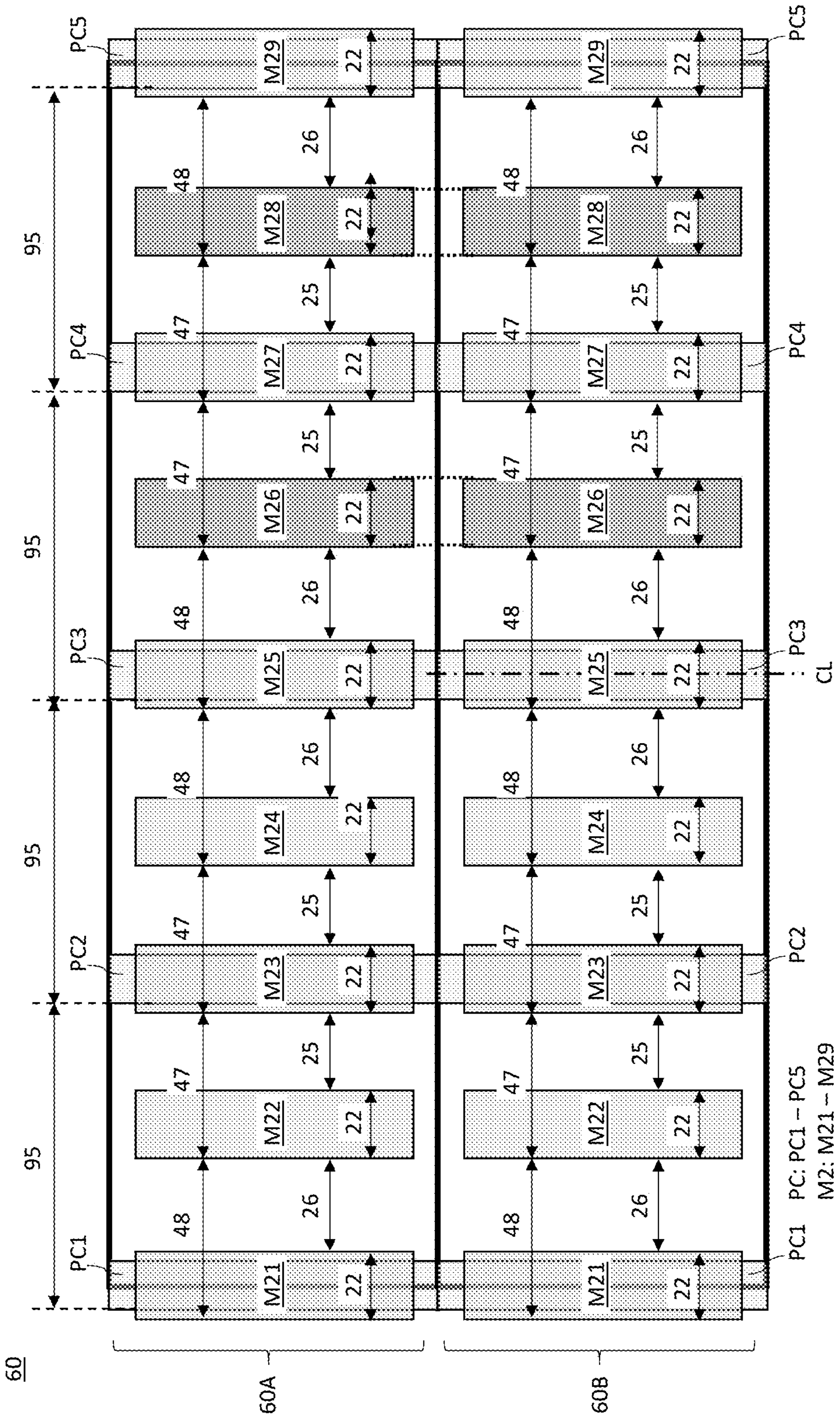
FIG. 6 illustrates a layout of a cell block formed of a plurality of semiconductor cells based on the semiconductor cell of FIG. 4, according to one or more embodiments.

FIG. 6 illustrates a layout of a cell block formed of a plurality of semiconductor cells based on the semiconductor cell of FIG. 4, according to one or more embodiments.

Referring to FIG. 6, a cell block 60 may be formed by combining a semiconductor cell 60A and a semiconductor cell 60B such that a lower boundary of the semiconductor cell 60A and an upper boundary of the semiconductor cell 60B are aligned with each other.

Further, the semiconductor cell 60A may be formed by placing two of the semiconductor cell 40 of FIG. 4 side by side in the D1 direction such that a right boundary of one semiconductor cell 40 is aligned with a left boundary of the other semiconductor cell 40. Thus, the semiconductor cell 60A may include gate structures PC1-PC5 arranged in the D1 direction at a gate pitch of 95 nm and M2 metal lines M21-M29 arranged in the D1 direction at two different metal pitches 48 nm and 47 nm and having two different metal-to-metal distances 26 nm and 25 nm.

In contrast, the semiconductor cell 60B may be obtained by placing the semiconductor cell 40 and a flipped semiconductor cell of the semiconductor cell 40 side by side in the D1 direction such that a right boundary RB of the semiconductor cell 40 is aligned with (or forms) a left boundary of the flipped semiconductor cell of the semiconductor cell 40. The flipped semiconductor cell of the semiconductor cell 40 may be formed by flipping (or turning) the semiconductor cell 40 with respect to a right boundary RB of the semiconductor cell 40. Thus, the placement of the gate structure PC and the M2 metal lines in a left half of the semiconductor cell 60B and that in a right half of the semiconductor cell 60B may be symmetric to each other with respect to a center line CL of the semiconductor cell 60B which may be a center line of the $3^{rd}$ gate structure PC3 and a center line of the metal line M25. For example, the metal-to-metal distances 26 nm, 25 nm, 25 nm and 26 nm in a left half of the semiconductor cell 60B may be symmetrical to the metal-to-metal distances 26 nm, 25 nm, 25 nm and 26 nm in a right half of the semiconductor cell 60B with respect to the center line CL of the semiconductor cell 60B.

However, unlike in the cell block 50 of FIG. 5, in the formation of the cell block 60 by combining the semiconductor cells 60A and 60B as shown in FIG. 6, all of the M2 metal lines including the metal lines M26 and M28 of the semiconductor cell 60A may be aligned with the M2 metal lines including the M26 and M28 of the semiconductor cell 60B, respectively, in the D2 direction. Thus, a connection between two cell elements (e.g., source/drain regions) in the semiconductor cells 60A and 60B through the two aligned metal lines may be more reliable and may achieve an area gain compared to a connection of the same two cell elements through two non-aligned metal lines as in the cell block 50 of FIG. 5.

Thus, the semiconductor cell 40 of FIG. 4 having a symmetric placement of the gate structures PC and the M2 metal lines with respect to the center line CL of the semiconductor cell 40 may enable formation of a cell block having an increased device density and improved device performance than the semiconductor cell 30A of FIG. 3A.

In the above embodiments of FIGS. 3A-3B through 6, the semiconductor cells 30A, 30B, 40, 50 and 60 having a predetermined gate pitch and two different M2 metal pitches may be formed by placing the same-width (e.g., 22 nm) M2 metal lines to have to different metal-to-metal distances (e.g., 26 nm and 25 nm). However, semiconductor cells having an predetermined gate pitch and two different M2 metal pitches may also be formed by differentiating metal widths while a metal-to-metal distance is fixed as described below.

Figure 7:
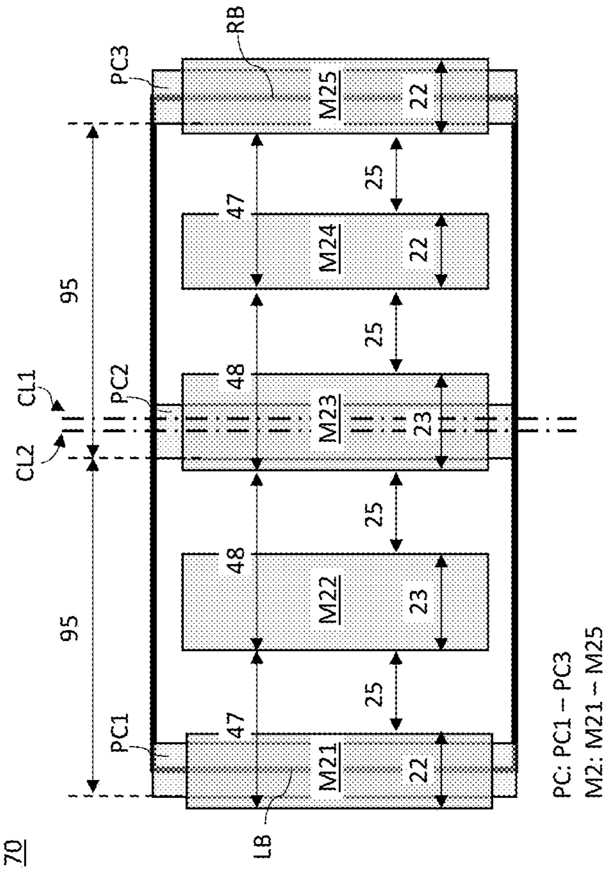
FIG. 7 illustrates a layout of a semiconductor cell including a plurality of M2 metal lines having different metal widths and different metal pitches that satisfy a fundamental accuracy, according to one or more embodiments.

FIG. 7 illustrates a layout of a semiconductor cell including a plurality of M2 metal lines having different metal widths and different metal pitches that satisfy a fundamental accuracy, according to one or more embodiments.

Referring to FIG. 7, a semiconductor cell 70 may include the same or similar gate structures PC1-PC3 and M2 metal lines M21-M25 as those of the semiconductor cells 30A and 40 shown in FIGS. 3A and 4, respectively, except that the M2 metal lines in the semiconductor cell 70 have two different metal widths while any two of the M2 metal lines adjacent or placed next to each other have a same metal-to-metal distance to implement different metal pitches.

For example, when a fundamental accuracy is 1 nm, the semiconductor cell 70 may be configured such that a gate pitch is set to the same 95 nm as in the semiconductor cells 30A and 40 Further, metal pitches across metal lines M21 through M25 may be set to 47 nm, 48 nm, 48 nm, and 47 nm, respectively. In other words, a metal pitch between the metal lines M21 and M22 may be set to 47 nm, a metal pitch between the metal lines M22 and M23 may be set to 48 nm, a metal pitch between the metal lines M23 and M24 may be set to 48 nm, and a metal pitch between the metal lines M24 and M25 may be set to 47 nm. However, unlike in the semiconductor cells 30A and 40 of FIGS. 3A and 4, the two different metal pitches 47 nm and 48 nm may be implemented by placing the M2 metal lines having two different metal widths while a metal-to-metal distance of any two of the M2 metal lines is fixed to 25 nm. For example, the metal lines M21, M24 and M25 may each have the width 22 nm and the metal lines M22 and M23 may each have the width 23 nm.

Thus, in the semiconductor cell 70, each of the metal pitches 48 nm and 47 nm, the metal-to-metal distance 25 nm, and the metal widths 22 nm and 23 nm is an integer multiple of the fundamental accuracy (1 nm) to satisfy the fundamental accuracy regardless of the gate pitch and the gear ratio, so that the process risk that may occur manufacturing a semiconductor device based on the semiconductor cell 20 of FIG. 2 may be avoided.

However, unlike in the semiconductor cells 30A and 40, when the metal lines M21, M23 and M25 are placed above or aligned with the gate structures PC1, PC2 and PC3, respectively, a center line CL1 of the metal line M23 may not be placed above or aligned with a center line CL2 of the gate structure PC2 in an overlapping manner in the D3 direction. Still, however, metal pitches across these three metal lines M21, M23 and M25 respectively aligned with the gate structures PC1, PC2 and PC3 may be the same. In other words, a metal pitch (47 nm+48 nm) between the metal lines M21 and M23 may be the same as a metal pitch (48 nm+47 nm) between the metal lines M23 and M25, that is, 95 nm.

Figure 8:
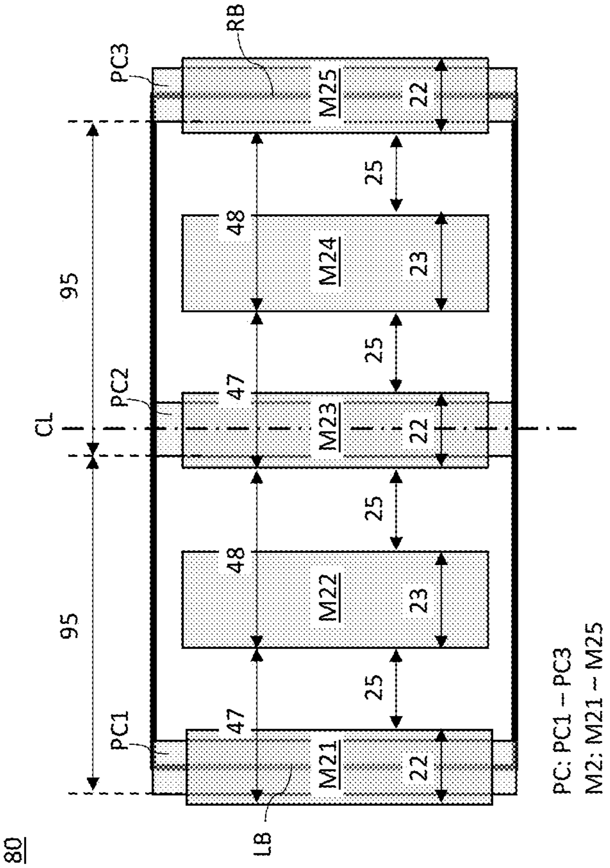
FIG. 8 illustrates a layout of another semiconductor cell including a plurality of M2 metal lines having different metal widths and different metal pitches that satisfy a fundamental accuracy, according to one or more embodiments.

FIG. 8 illustrates a layout of another semiconductor cell including a plurality of M2 metal lines having different metal widths and different metal pitches that satisfy a fundamental accuracy, according to one or more embodiments.

Referring to FIG. 8, a semiconductor cell 80 may include the same or similar gate structures PC1-PC3 and M2 metal lines M21-M25 as those of the semiconductor cell 70 of FIG. 7 except that the M2 metal lines in the semiconductor cell 80 have two different metal widths and two different metal pitches in a different manner while any two of the M2 metal lines adjacent or placed next to each other still has a same metal-to-metal distance to implement different metal pitches.

For example, when a fundamental accuracy is 1 nm, the semiconductor cell 80 may be configured such that, while a gate pitch is set to the same 95 nm as in the semiconductor cell 70. Further, metal pitches across metal lines M21 through M25 may be set to 47 nm, 48 nm, 47 nm, and 48 nm, respectively. In other words, a metal pitch between the metal lines M21 and M22 may be set to 47 nm, a metal pitch between the metal lines M22 and M23 may be set to 48 nm, a metal pitch between the metal lines M23 and M24 may be set to 47 nm, and a metal pitch between the metal lines M24 and M25 may be set to 48 nm. Further, in the semiconductor cell 80, the two different metal pitches 47 nm and 48 nm may be implemented by the M2 metal lines having two different-widths while a metal-to-metal distance of any two of the M2 metal lines is fixed to 25 nm. For example, the metal lines M21, M23 and M25 may each have the width 22 nm and the metal lines M22 and M24 may each have the width 23 nm.

Thus, in the semiconductor cell 80, each of the metal pitches 48 nm and 47 nm and the metal-to-metal distance 25 nm, and the metal widths 22 nm and 23 nm is an integer multiple of the fundamental accuracy (1 nm) to satisfy the fundamental accuracy regardless of the gate pitch and the gear ratio, so that the process risk that may occur manufacturing a semiconductor device based on the semiconductor cell 20 of FIG. 2 may be avoided.

However, unlike in the semiconductor cell 70, the metal lines M21, M23 and M25 may be placed above or aligned with the gate structures PC1, PC2 and PC3, respectively, such that a center line CL of the semiconductor cell 80 is also a center line of the metal line 23 and a center line of the gate structure PC2. Further, metal pitches across these three metal lines M21, M23 and M25 respectively aligned with the gate structures PC1, PC2 and PC3 may be the same. In other words, a metal pitch (47 nm+48 nm) between the metal lines M21 and M23 may be the same as a metal pitch (47 nm+48 nm) between the metal lines M23 and M25, that is, 45 nm.

In the meantime, the semiconductor cell 80 may be configured such that the placement of the gate structures PC and the M2 metal lines in a left half thereof and that in a right half of thereof are symmetric to each other with respect to the center line CL of the semiconductor cell 80. This symmetric placement of the gate structures PC and the M2 metal lines in the semiconductor cell 80 may enable a cell block based on the semiconductor cell 80 to achieve an area gain and an improved device performance compared to a cell block based on the semiconductor cell 70, as described below in reference to FIGS. 9 and 10.

Figure 9:
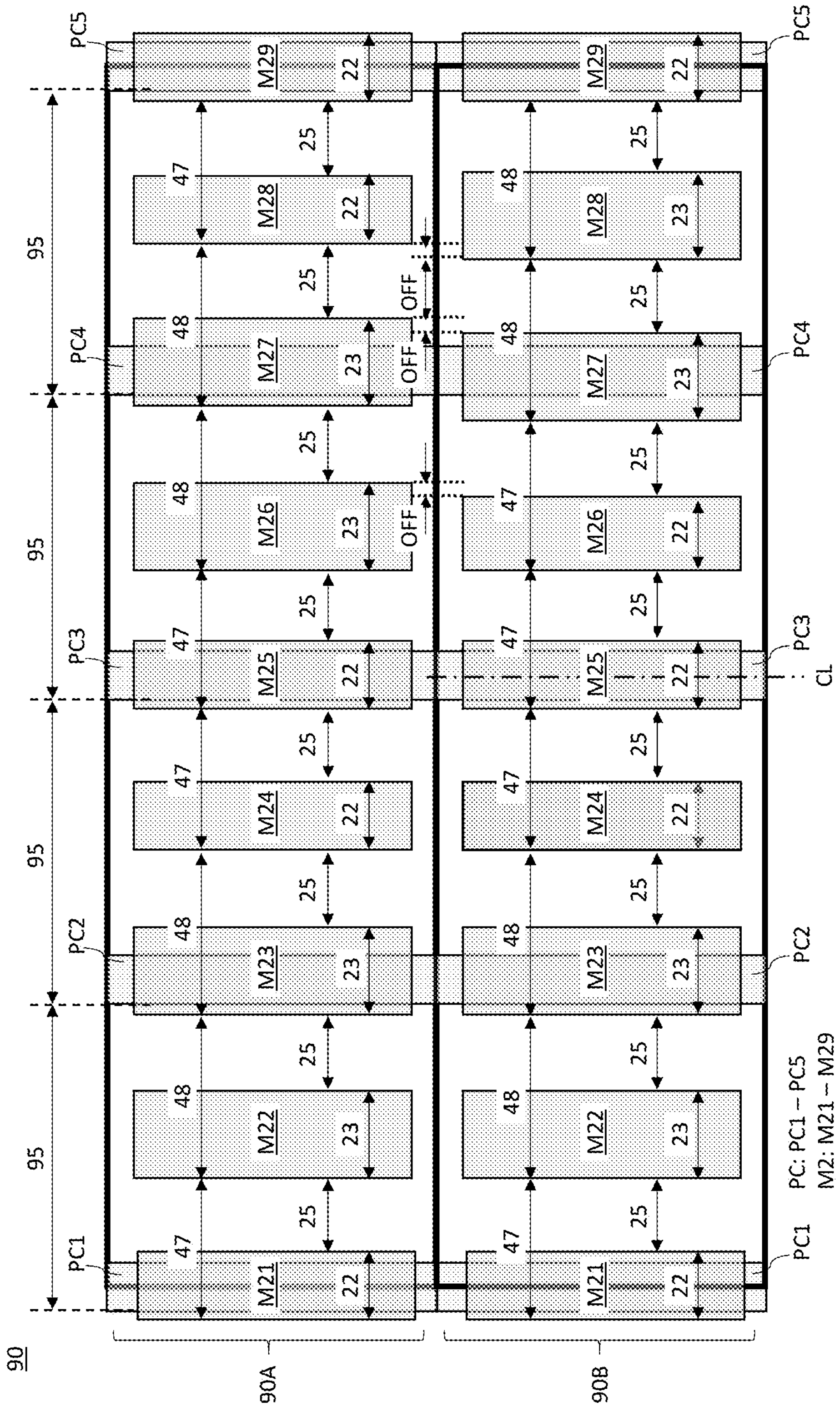
FIG. 9 illustrates a layout of a cell block formed of a plurality of semiconductor cells based on the semiconductor cell of FIG. 7, according to one or more embodiments.

FIG. 9 illustrates a layout of a cell block formed of a plurality of semiconductor cells based on the semiconductor cell of FIG. 7, according to one or more embodiments.

Referring to FIG. 9, a cell block 90 may be formed by combining a semiconductor cell 90A and a semiconductor cell 90B such that a lower boundary of the semiconductor cell 90A and an upper boundary of the semiconductor cell 90B are aligned with each other.

Further, the semiconductor cell 90A may be formed by placing two of the semiconductor cell 70 of FIG. 7 side by side in the D1 direction such that a right boundary of one semiconductor cell 70 is aligned with a left boundary of the other semiconductor cell 70. Thus, the semiconductor cell 90A may include gate structures PC1-PC5 arranged in the D1 direction at a gate pitch of 95 nm and M2 metal lines M21-M29 having two different widths 22 nm and 23 nm and arranged in the D1 direction at two different metal pitches 47 nm and 48 nm while a metal-to-metal distance is fixed to 25 nm.

In contrast, the semiconductor cell 90B may be obtained by placing the semiconductor cell 70 and a flipped semiconductor cell of the semiconductor cell 70 side by side in the D1 direction such that a right boundary RB of the semiconductor cell 70 is aligned with (or forms) a left boundary of the flipped semiconductor cell of the semiconductor cell 70. The flipped semiconductor cell of the semiconductor cell 70 may be formed by flipping (or turning) the semiconductor cell 70 with respect to the right boundary RB of the semiconductor cell 70. Thus, the placement of the gate structures PC and the M2 metal lines in a left half of the semiconductor cell 90B and that in a right half of the semiconductor cell 90B may be symmetric to each other with respect to a center line CL thereof which may be a center line of the 3$^{rd}$ gate structure PC3 and a center line of the metal line M25.

However, in the formation of the cell block 90 by combining the semiconductor cells 90A and 90B as shown in FIG. 9, the metal lines M26-M28 of the semiconductor cell 90A may not be aligned with the metal lines M26-M28 of the semiconductor cell 50B, respectively, in the D2 direction, and instead, may have an horizontal offset OFF. Thus, a connection between two cell elements (e.g., source/drain regions) in the semiconductor cells 90A and 90B through the two non-aligned metal lines M26 (or M27 or M28) may not be reliable and may cause an additional area compared to a connection of the same two cell elements through two aligned metal lines as described below in reference to FIG. 10.

Figure 10:
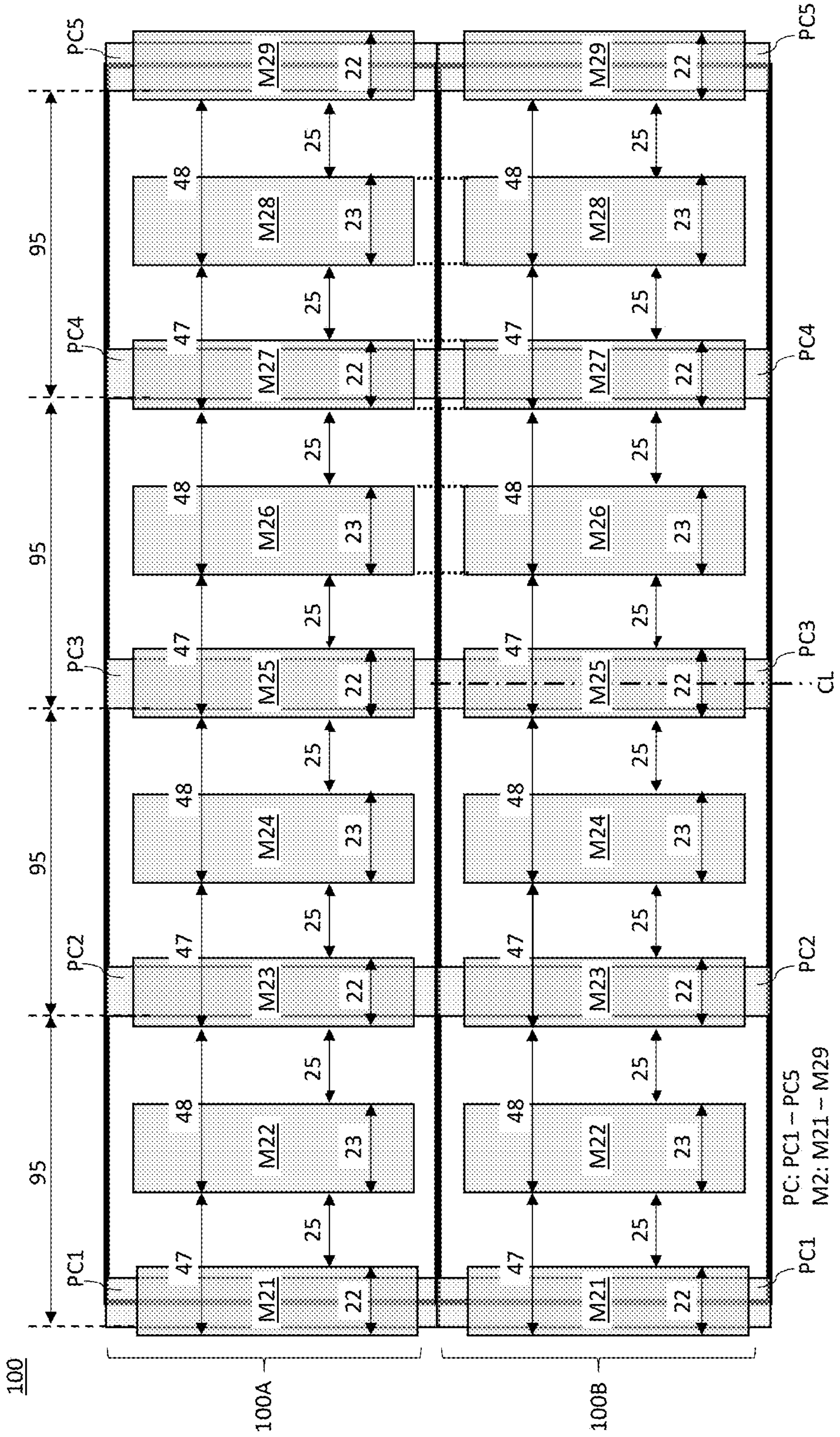
FIG. 10 illustrates a layout of a cell block formed of a plurality of semiconductor cells based on the semiconductor cell of FIG. 8, according to one or more embodiments.

FIG. 10 illustrates a layout of a cell block formed of a plurality of semiconductor cells based on the semiconductor cell of FIG. 8, according to one or more embodiments.

Referring to FIG. 10, a cell block 100 may be formed by combining a semiconductor cell 100A and a semiconductor cell 100B such that a lower boundary of the semiconductor cell 100A and an upper boundary of the semiconductor cell 100B are aligned with each other.

Further, the semiconductor cell 100A may be formed by placing two of the semiconductor cell 80 of FIG. 8 side by side in the D1 direction such that a right boundary of one semiconductor cell 80 is aligned with a left boundary of the other semiconductor cell 80. Thus, the semiconductor cell 100A may include gate structures PC1-PC5 arranged in the D1 direction at a gate pitch of 95 nm and M2 metal lines M21-M29 having two different widths 22 nm and 23 nm and arranged in the D1 direction at two different metal pitches 47 nm and 48 nm while a metal-to-metal distance is fixed to 25 nm.

In contrast, the semiconductor cell 100B may be obtained by placing the semiconductor cell 80 and a flipped semiconductor cell of the semiconductor cell 80 side by side in the D1 direction such that a right boundary RB of the semiconductor cell 80 is aligned with (or forms) a left boundary of the flipped semiconductor cell of the semiconductor cell 80. The flipped semiconductor cell of the semiconductor cell 80 may be formed by flipping (or turning) the semiconductor cell 40 with respect to the right boundary RB of the semiconductor cell 80. Thus, the placement of the gate structure PC and the M2 metal lines in a left half of the semiconductor cell 100B and that in a right half of the semiconductor cell 100B may be symmetric to each other with respect to a center line CL of the semiconductor cell 100B which may be a center line of the 3$^{rd}$ gate structure PC3 and a center line of the metal line M25.

However, unlike in the cell block 90 of FIG. 9, in the formation of the cell block 100 by combining the semiconductor cells 100A and 100B as shown in FIG. 10, all of the M2 metal lines including the metal lines M26-M28 of the semiconductor cell 100A may be aligned with the M2 metal lines including the M26-M28 of the semiconductor cell 100B, respectively, in the D2 direction. Thus, a connection between two cell elements (e.g., source/drain regions) in the semiconductor cells 100A and 100B through the two aligned metal lines may be more reliable and achieve an area gain compared to a connection of the same two cell elements through two non-aligned metal lines as in the cell block 90 of FIG. 9.

Thus, the semiconductor cell 80 of FIG. 8 having a symmetric placement of the gate structures PC and the M2 metal lines with respect to the center line CL of the semiconductor cell 80 may enable formation of a cell block having an increased device density and improved device performance than the semiconductor cell 70 of FIG. 7. In the above embodiments, each of the semiconductor cells 30A, 30B, 40, 70 and 80 has two different metal pitches and two different metal-to-metal distances or two different metal widths. However, the disclosure is not limited thereto. According to one or more embodiments, a semiconductor cell may be configured to have more than two different metal pitches, more than two different metal-to-metal distances, and/or more than two different metal widths when a gate pitch of the semiconductor cell is predetermined so that each of the metal pitches, the metal-to-metal distances and the metal widths that satisfies a fundamental accuracy to avoid a manufacturing process risk.

In the above embodiments, the fundamental accuracy is indicated as 1 nm or 0.5 nm. However, the disclosure is not limited thereto, and the fundamental accuracy may be greater or smaller than 1 nm or 0.5 nm according to one or more embodiments. In the above embodiments, the four dimensions, that is, the gate pitch, the metal pitch, the metal-to-metal distance, and the metal width are set to specific numbers such as 95 nm, 48 nm, 47 nm, 26 nm, 25 nm, 23 nm, and 22 nm, respectively. However, the disclosure is not limited thereto, and these dimensional may be set to different numbers according to one or more embodiments. In some of the above embodiments, each of the four dimensions is set to an integer multiple of a fundamental accuracy to satisfy the fundamental accuracy when a gate pitch is set to an integer multiple of the fundamental accuracy. However, the disclosure is not limited thereto, and only the gate pitch and one or two of the other three dimensions may be set to an integer multiple according to one or more embodiments.

Each of the semiconductor cells 30A,30B, 40, 70 and 80 may be a standard cell in which a logic circuit is configured to perform one or more logic operations or functions such as AND, OR, NOT (inverter), NAND, NOR, XOR, XNOR, AOI, multiplexer, and their combination, not being limited thereto. These logic circuits are a building block of an integrated circuit. Further, each of the cell blocks 50, 60, 90 and 100 formed of a plurality of semiconductor cells may form an integrated circuit to be manufactured as a semiconductor device.

Herein, each of the semiconductor cells 30A, 30B, 40, 70 and 80 and the cell blocks 50, 60, 90 and 100 shown in FIGS. 3A-3B through FIG. 10 may be referred to as a semiconductor device because this semiconductor device may be formed based on the corresponding semiconductor cell or cell block.

Figure 11:
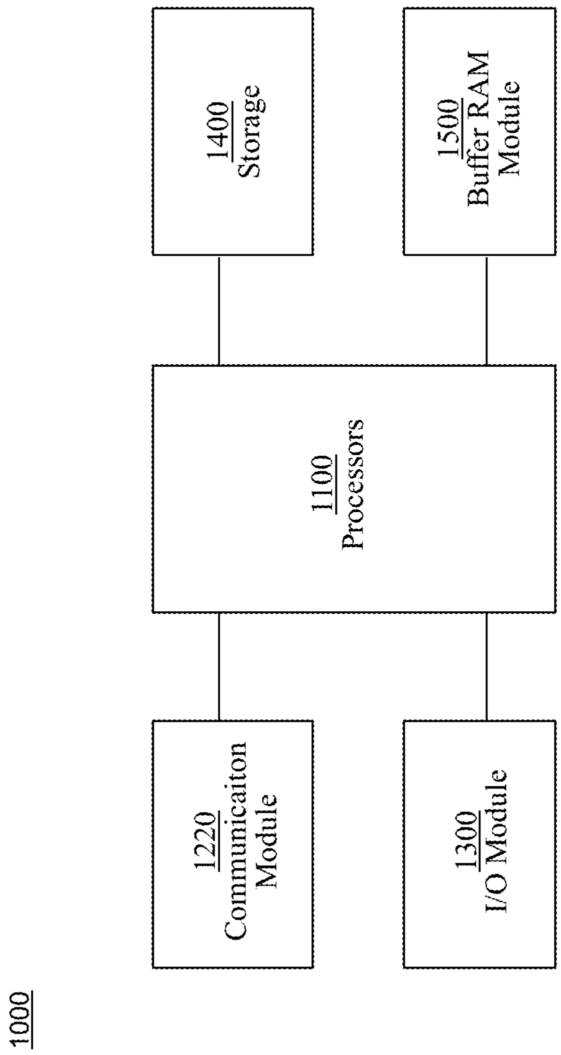
FIG. 11 is a schematic block diagram illustrating an electronic device including at least one semiconductor device based on at least one of the semiconductor cells and the cell blocks shown in FIGS. 3A-3B through FIG. 10, according to one or more embodiments.

FIG. 11 is a schematic block diagram illustrating an electronic device including at least one semiconductor device based on at least one of the semiconductor cells and the cell blocks shown in FIGS. 3A-3B through FIG. 10, according to one or more embodiments.

Referring to FIG. 11, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 11, the electronic device 1000 may further include at least one sensor such as an image sensor.

At least one component in the electronic device 1000 may be formed based on at least one of the semiconductor cells 30A, 30B, 40, 70 and 80 and the cell blocks 50, 60, 90 and 100 shown in FIGS. 3A-3B through FIG. 10, according to one or more embodiments.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A semiconductor device comprising:

a plurality of gate structures arranged at a predetermined gate pitch in a $1^{st}$ direction and extended in a $2^{nd}$ direction intersecting the $1^{st}$ direction; and a plurality of metal lines arranged at two or more different metal pitches in the $1^{st}$ direction and extended in the $2^{nd}$ direction at a same level in a $3^{rd}$ direction intersecting the $1^{st}$ and $2^{nd}$ directions, wherein the plurality of metal lines comprises a first subgroup of metal lines and a second subgroup of metal lines, one of the first subgroup of metal lines overlapping a first one of the plurality of gate structures in the $3^{rd}$ direction and one of the second subgroup of metal lines overlapping a second one of the plurality of gate structures in the $3^{rd}$ direction, wherein the first subgroup of metal lines and the second subgroup of metal lines have a same metal pitch in the $1^{st}$ direction.

2. The semiconductor device of claim 1, wherein, among the plurality of metal lines, first two adjacent metal lines and second two adjacent metal lines have a same metal pitch.

3. The semiconductor device of claim 1, one of the plurality of metal lines is between the one of the first subgroup of metal lines and the one of the second subgroup of metal lines.

4. The semiconductor device of claim 1, wherein the plurality of metal lines have a same width in the $1^{st}$ direction.

5. The semiconductor device of claim 1, wherein the plurality of gate structures comprise $1^{st}$ and $2^{nd}$ gate structures placed next to each other, wherein the plurality of metal lines comprise $1^{st}$ through $4^{th}$ metal lines placed next to each other, and wherein a $3^{rd}$ metal line overlaps the $2^{nd}$ gate structure in the $3^{rd}$ direction, wherein a metal pitch between the $1^{st}$ and $2^{nd}$ metal lines is different from a metal pitch between the $2^{nd}$ and $3^{rd}$ metal lines, and wherein the metal pitch between the $1^{st}$ and $2^{nd}$ metal lines is the same as a metal pitch between the $3^{rd}$ and $4^{th}$ metal lines.

6. The semiconductor device of claim 1, wherein the plurality of gate structures comprise $1^{st}$ and $2^{nd}$ gate structures placed next to each other, wherein the plurality of metal lines comprise $1^{st}$ through $4^{th}$ metal lines placed next to each other, and wherein a $3^{rd}$ metal line overlaps the $2^{nd}$ gate structure in the $3^{rd}$ direction, wherein a metal pitch between the $1^{st}$ and $2^{nd}$ metal lines is different from a metal pitch between the $2^{nd}$ and $3^{rd}$ metal lines, and wherein the metal pitch between the $2^{nd}$ and $3^{rd}$ metal lines is the same as a metal pitch between the $3^{rd}$ and $4^{th}$ metal lines.

7. The semiconductor device of claim 1, wherein the plurality of metal lines have two or more different widths in the $1^{st}$ direction.

8. The semiconductor device of claim 1, wherein any two adjacent metal lines among the plurality of metal lines are spaced apart from each other by a same distance in the $1^{st}$ direction.

9. The semiconductor device of claim 1, wherein the plurality of gate structures comprise $1^{st}$ and $2^{nd}$ gate structures placed next to each other, wherein the plurality of metal lines comprise a $1^{st}$ metal line between the $1^{st}$ and $2^{nd}$ gate structures, a $2^{nd}$ metal line overlapping the $2^{nd}$ gate structure in the $3^{rd}$ direction, and a $3^{rd}$ metal line opposite to the $1^{st}$ metal line with respect to the $2^{nd}$ gate structure, and wherein a metal pitch between the $1^{st}$ and $2^{nd}$ metal lines is the same as a metal pitch between the $2^{nd}$ and $3^{rd}$ metal lines.

10. A semiconductor device comprising:

a plurality of gate structures arranged at a predetermined gate pitch in a $1^{st}$ direction and extended in a $2^{nd}$ direction intersecting the $1^{st}$ direction; and a plurality of metal lines arranged in the $1^{st}$ direction to have two or more different metal-to-metal distances and extended in the $2^{nd}$ direction at a same level in a $3^{rd}$ direction intersecting the $1^{st}$ and $2^{nd}$ directions, wherein the plurality of metal lines comprises a first subgroup of metal lines and a second subgroup of metal lines, one of the first subgroup of metal lines overlapping a first one of the plurality of gate structures in the $3^{rd}$ direction and one of the second subgroup of metal lines overlapping a second one of the plurality of gate structures in the $3^{rd}$ direction, wherein the first subgroup of metal lines and the second subgroup of metal lines have a same metal pitch in the $1^{st}$ direction.

11. The semiconductor device of claim 10, wherein the plurality of metal lines are arranged in at two or more different metal pitches in the $1^{st}$ direction.

12. The semiconductor device of claim 10, wherein the plurality of metal lines have a same width in the $1^{st}$ direction.

13. The semiconductor device of claim 10, wherein the plurality of gate structures comprise $1^{st}$ and $2^{nd}$ gate structures placed next to each other, wherein the plurality of metal lines comprises $1^{st}$ through $4^{th}$ metal lines placed next to each other, and wherein a $3^{rd}$ metal line overlaps the $2^{nd}$ gate structure in the $3^{rd}$ direction, wherein a metal pitch between the $1^{st}$ and $2^{nd}$ metal lines is different from a metal pitch between the $2^{nd}$ and $3^{rd}$ metal lines, and wherein the metal pitch between the $1^{st}$ and $2^{nd}$ metal lines is the same as a metal pitch between the $3^{rd}$ and $4^{th}$ metal lines.

14. The semiconductor device of claim 10, wherein the plurality of gate structures comprise $1^{st}$ and $2^{nd}$ gate structures placed next to each other, wherein the plurality of metal lines comprise $1^{st}$ through $4^{th}$ metal lines placed next to each other, and wherein a $3^{rd}$ metal line overlaps the $2^{nd}$ gate structure in the $3^{rd}$ direction, wherein a metal pitch between the $1^{st}$ and $2^{nd}$ metal lines is different from a metal pitch between the $2^{nd}$ and $3^{rd}$ metal lines, and wherein the metal pitch between the $2^{nd}$ and $3^{rd}$ metal lines is the same as a metal pitch between the $3^{rd}$ and $4^{th}$ metal lines.

15. A semiconductor device comprising:

a plurality of gate structures arranged at a predetermined gate pitch in a $1^{st}$ direction and extended in a $2^{nd}$ direction intersecting the $1^{st}$ direction; and a plurality of metal lines arranged in the $1^{st}$ direction, having two or more different widths in the $1^{st}$ direction, and extended in the $2^{nd}$ direction at a same level in a $3^{rd}$ direction intersecting the $1^{st}$ and $2^{nd}$ directions, wherein the plurality of metal lines comprises a first subgroup of metal lines and a second subgroup of metal lines, one of the first subgroup of metal lines overlapping a first one of the plurality of gate structures in the $3^{rd}$ direction and one of the second subgroup of metal lines overlapping a second one of the plurality of gate structures in the $3^{rd}$ direction, wherein the first subgroup of metal lines and the second subgroup of metal lines have a same metal pitch in the $1^{st}$ direction.

16. The semiconductor device of claim 15, wherein the plurality of metal lines are arranged in at two or more different metal pitches in the $1^{st}$ direction.

17. The semiconductor device of claim 15, wherein the plurality of metal lines have a same metal-to-metal distance in the $1^{st}$ direction.

18. The semiconductor device of claim 15, wherein the plurality of gate structures comprise $1^{st}$ and $2^{nd}$ gate structures placed next to each other, wherein the plurality of metal lines comprises $1^{st}$ through $4^{th}$ metal lines placed next to each other, and wherein a $3^{rd}$ metal line overlaps the $2^{nd}$ gate structure in the $3^{rd}$ direction, wherein a metal pitch between the $1^{st}$ and $2^{nd}$ metal lines is different from a metal pitch between the $2^{nd}$ and $3^{rd}$ metal lines, and wherein the metal pitch between the $2^{nd}$ and $3^{rd}$ metal lines is the same as a metal pitch between the $3^{rd}$ and $4^{th}$ metal lines.

* * * * *